(12) United States Patent
Obu et al.

(10) Patent No.: US 11,309,852 B2
(45) Date of Patent: Apr. 19, 2022

(54) POWER AMPLIFIER AND COMPOUND SEMICONDUCTOR DEVICE

(71) Applicant: Murata Manufacturing Co., Ltd., Kyoto (JP)

(72) Inventors: Isao Obu, Kyoto (JP); Satoshi Tanaka, Kyoto (JP); Takayuki Tsutsui, Kyoto (JP); Yasunari Umemoto, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 72 days.

(21) Appl. No.: 16/995,902

(22) Filed: Aug. 18, 2020

(65) Prior Publication Data

US 2020/0382083 A1 Dec. 3, 2020

Related U.S. Application Data

(63) Continuation of application No. 16/192,890, filed on Nov. 16, 2018, now Pat. No. 10,778,159.

(30) Foreign Application Priority Data

Nov. 20, 2017 (JP) .............................. JP2017-222992
Jul. 26, 2018 (JP) .............................. JP2018-140613

(51) Int. Cl.
   *H03F 3/21* (2006.01)
   *H03F 3/19* (2006.01)
   (Continued)

(52) U.S. Cl.
   CPC .......... *H03F 3/211* (2013.01); *H01L 21/8252* (2013.01); *H01L 27/0605* (2013.01); (Continued)

(58) Field of Classification Search
   CPC ...................................................... H03F 3/211
   See application file for complete search history.

(56) References Cited

U.S. PATENT DOCUMENTS

| 4,617,927 A | 10/1986 | Manes |
| 5,838,031 A | 11/1998 | Kobayashi et al. |

(Continued)

FOREIGN PATENT DOCUMENTS

| JP | H11195939 A | 7/1999 |
| JP | 2010-278521 A | 12/2010 |
| JP | 2013-526169 A | 6/2013 |

OTHER PUBLICATIONS

Chang et al., "Design and Analysis of a DC-43.5-GHz Fully Integrated Distributed Amplifier Using GaAS Hempt-HBT Cascode Gain Stage", IEEE Transactions on Microwave Theory and Techniques, Feb. 2011, vol. 59, No. 2, IEEE.

*Primary Examiner* — Patricia T Nguyen
(74) *Attorney, Agent, or Firm* — Pearne & Gordon LLP

(57) ABSTRACT

A power amplifier includes initial-stage and output-stage amplifier circuits, and initial-stage and output-stage bias circuits. The initial-stage amplifier circuit includes a first high electron mobility transistor having a source electrically connected to a reference potential, and a gate to which a radio-frequency input signal is inputted, and a first heterojunction bipolar transistor having an emitter electrically connected to a drain of the first high electron mobility transistor, a base electrically connected to the reference potential in an alternate-current fashion, and a collector to which direct-current power is supplied and from which a radio-frequency signal is outputted. The output-stage amplifier circuit includes a second heterojunction bipolar transistor having an emitter electrically connected to the reference potential, a base to which the radio-frequency signal outputted from the first heterojunction bipolar transistor is inputted, and a collector to which direct-current power is supplied and from which a radio-frequency output signal is outputted.

20 Claims, 12 Drawing Sheets

(51) Int. Cl.
*H03F 1/56* (2006.01)
*H03F 1/02* (2006.01)
*H01L 27/06* (2006.01)
*H01L 21/8252* (2006.01)

(52) U.S. Cl.
CPC ........ *H01L 27/0623* (2013.01); *H03F 1/0211* (2013.01); *H03F 1/56* (2013.01); *H03F 3/19* (2013.01); *H03F 2200/222* (2013.01); *H03F 2200/318* (2013.01); *H03F 2200/387* (2013.01); *H03F 2200/451* (2013.01)

(56) References Cited

U.S. PATENT DOCUMENTS

| | | | |
|---|---|---|---|
| 5,920,230 | A | 7/1999 | Beall |
| 5,923,217 | A * | 7/1999 | Durec .................... G05F 3/265 330/288 |
| 6,204,728 | B1 | 3/2001 | Hageraats |
| 9,520,836 | B1 | 12/2016 | Kaper |
| 2007/0229167 | A1 | 10/2007 | Wu |
| 2008/0079495 | A1* | 4/2008 | Amano .................... H03F 3/195 330/296 |
| 2010/0301944 | A1 | 12/2010 | Yamamoto et al. |
| 2013/0093520 | A1 | 4/2013 | Roux et al. |
| 2017/0338773 | A1* | 11/2017 | Balteanu ............... H03F 1/0277 |
| 2017/0359038 | A1* | 12/2017 | Tanaka ................... H03F 3/245 |
| 2018/0054166 | A1 | 2/2018 | Pehlivanoglu |
| 2018/0294781 | A1* | 10/2018 | Rogers ................... H03F 3/195 |
| 2020/0036341 | A1* | 1/2020 | Klaren ................. H03F 1/0222 |
| 2021/0058041 | A1* | 2/2021 | Nobbe .................... H03F 3/211 |
| 2021/0159856 | A1* | 5/2021 | Hoogzaad ............. H03F 1/0261 |

* cited by examiner

POWER AMPLIFIER AND COMPOUND SEMICONDUCTOR DEVICE

This application claims priority from U.S. patent application Ser. No. 16/192,890 filed Nov. 16, 2018, which claims priority from Japanese Patent Application No. 2018-140613 filed on Jul. 26, 2018, and which claims priority from Japanese Patent Application No. 2017-222992 filed on Nov. 20, 2017. The contents of these applications are incorporated herein by reference in their entireties.

BACKGROUND OF THE DISCLOSURE

1. Field of the Disclosure

The present disclosure relates to a power amplifier and a compound semiconductor device.

2. Description of the Related Art

A mobile communication system is now going to transit from the fourth generation (4G) to the fifth generation (5G). The mobile communication system of the fifth generation additionally uses a higher frequency band than in the fourth generation. As frequency becomes higher, a power loss in a radio frequency circuit increases. Therefore, a higher gain and a higher output are strongly demanded for a radio-frequency power amplifier that is one of the main components of the fifth-generation communication devices (e.g., a cellular phone).

Japanese Unexamined Patent Application Publication No. 2010-278521 discloses a power amplifier in which an initial-stage amplifier element and a subsequent-stage amplifier element are formed on the same GaAs substrate. The initial-stage amplifier element is an enhancement-type field effect transistor, and the subsequent-stage amplifier element is a heterojunction bipolar transistor.

In the power amplifier disclosed in Japanese Unexamined Patent Application Publication No. 2010-278521, the enhancement-type field effect transistor is used as the initial-stage amplifier element with intent to operate the power amplifier only with a positive power supply and to eliminate a negative power supply.

Generally, in an enhancement-type field effect transistor using a compound semiconductor, even when a gate voltage is set to 0 V, a drain current Idss flows in a non-negligible amount (e.g., about $1 \times 10^{-6}$ A), and it cannot be completely cut off. The drain current Idss increases at higher temperature. This results in a problem that the power consumption of a battery in a communication device increases. With an increase in power consumption of the battery, a talk time is shortened.

BRIEF SUMMARY OF THE DISCLOSURE

The present disclosure has been made in view of the above-described situation, and an object of the present disclosure is to enable the suppression of the power consumption.

According to one preferred embodiment of the present disclosure, there is provided a power amplifier including an initial-stage amplifier circuit including a first high electron mobility transistor having a source electrically connected to a reference potential, and a gate to which a radio-frequency input signal is inputted, and a first heterojunction bipolar transistor having an emitter electrically connected to a drain of the first high electron mobility transistor, a base electrically connected to the reference potential in an alternate-current fashion, and a collector to which direct-current power is supplied and from which a radio-frequency signal is outputted; an output-stage amplifier circuit including a second heterojunction bipolar transistor having an emitter electrically connected to the reference potential, a base to which the radio-frequency signal outputted from the first heterojunction bipolar transistor is inputted, and a collector to which direct-current power is supplied and from which a radio-frequency output signal is outputted; an initial-stage bias circuit outputting a bias voltage to the gate of the first high electron mobility transistor and a bias voltage to the base of the first heterojunction bipolar transistor; and an output-stage bias circuit outputting a bias voltage to the base of the second heterojunction bipolar transistor.

With the above-described features, when a gate voltage of the first high electron mobility transistor and a base voltage of the first heterojunction bipolar transistor become 0 V, the first heterojunction bipolar transistor is brought into a cutoff region, and an emitter current does not flow. Thus, the first heterojunction bipolar transistor is shut down. Accordingly, a drain current does not flow in the first high electron mobility transistor. As a result, the power amplifier can suppress a current from flowing wastefully, and can suppress the power consumption.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

Embodiments of a power amplifier according to the present disclosure will be described in detail below with reference to the drawings. The present disclosure is not limited by the following embodiments. It is needless to say that the embodiments are merely illustrative, and that features of the different embodiments can be partially replaced or combined with each other. In the second and subsequent embodiments, description of matters common to those in the first embodiment is omitted, and only different points are described. In particular, similar advantageous effects obtained with similar features are not repeatedly described in each of the embodiments.

First Embodiment

Figure 1:
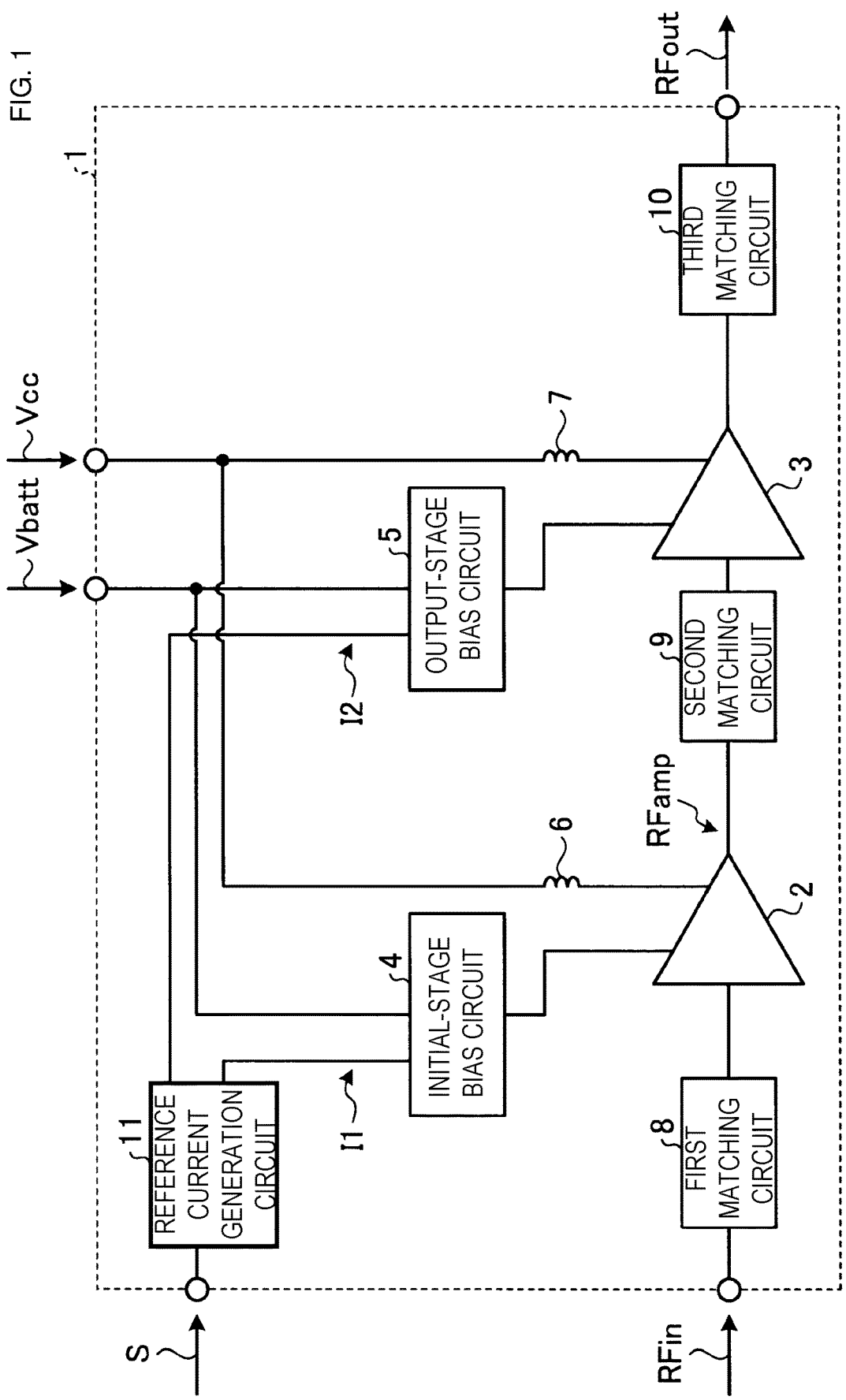
FIG. 1 is a diagram illustrating a configuration of a power amplifier according to a first embodiment.

FIG. 1 is a diagram illustrating a configuration of a power amplifier 1 according to a first embodiment of the present disclosure. The power amplifier 1 can be utilized in a mobile communication device, for example, a cellular phone, to transmit various signals, such as speech and data, to a base station.

The power amplifier 1 amplifies a radio-frequency input signal RFin that is inputted from a circuit in a preceding stage. Furthermore, the power amplifier 1 outputs, to a circuit in a subsequent stage, a radio-frequency output signal RFout having been amplified. The circuit in the preceding stage is, for example, a transmission power control circuit for adjusting the power of a modulated signal, but it is not limited to such an example. The circuit in the subsequent stage is, for example, a front-end circuit for carrying out filtering, etc. on the radio-frequency output signal RFout, and for transmitting the processed signal to an antenna, but it is not limited to such an example. A frequency of the radio-frequency input signal RFin is, for example, from about several GHz (gigahertz) to about several ten GHz, but it is not limited to such an example.

The power amplifier 1 includes the initial-stage amplifier circuit 2 for amplifying the radio-frequency input signal RFin and outputting a radio-frequency signal RFamp having been amplified, and an output-stage amplifier circuit 3 for amplifying the radio-frequency signal RFamp and outputting the radio-frequency output signal RFout having been amplified. The initial-stage amplifier circuit 2 and the output-stage amplifier circuit 3 constitute a two-stage amplifier circuit. The number of stages of the amplifier circuit is not limited to two, and it may be one or three or more.

The power amplifier 1 further includes an initial-stage bias circuit 4 for setting an electrical bias state of the initial-stage amplifier circuit 2. The initial-stage bias circuit 4 outputs a bias voltage to the initial-stage amplifier circuit 2. The power amplifier 1 further includes an output-stage bias circuit 5 for setting an electrical bias state of the output-stage amplifier circuit 3. The output-stage bias circuit 5 outputs a bias voltage to the output-stage amplifier circuit 3.

The power amplifier 1 further includes a choke inductor 6 connected between a power supply potential Vcc and the initial-stage amplifier circuit 2. The power amplifier 1 further includes a choke inductor 7 connected between the power supply potential Vcc and the output-stage amplifier circuit 3. The choke inductor 6 and the choke inductor 7 have the function of choking AC power.

It is assumed that the choke inductors 6 and 7 have sufficiently high impedances with respect to frequency bands of the radio-frequency input signal RFin, the radio-frequency signal RFamp, and the radio-frequency output signal RFout. In other words, the impedances of the choke inductors 6 and 7 are negligible when considering the frequency bands of the radio-frequency input signal RFin, the radio-frequency signal RFamp, and the radio-frequency output signal RFout. Furthermore, the choke inductors 6 and 7 suppress coupling of the radio-frequency input signal RFin, the radio-frequency signal RFamp, and the radio-frequency output signal RFout to a power supply circuit.

The power amplifier 1 further includes a first matching circuit 8 for making impedance matching between the circuit in the preceding stage and the initial-stage amplifier circuit 2, a second matching circuit 9 for making impedance matching between the initial-stage amplifier circuit 2 and the output-stage amplifier circuit 3, and a third matching circuit 10 for making impedance matching between the output-stage amplifier circuit 3 and the circuit in the subsequent stage. The first matching circuit 8, the second matching circuit 9, and the third matching circuit 10 can be each constituted using a capacitor, an inductor, and a resistance.

The power amplifier 1 further includes a reference current generation circuit 11 that outputs a reference current I1 to the initial-stage bias circuit 4, and that outputs a reference current I2 to the output-stage bias circuit 5. The reference current generation circuit may be constituted separately for each of the output-stage bias circuit 5 and the initial-stage bias circuit 4.

When a control signal S supplied from an external circuit is at a high level, the reference current generation circuit 11 outputs the positive and constant reference current I1 (I1>0) to the initial-stage bias circuit 4, and outputs the positive and constant reference current I2 (I2>0) to the output-stage bias circuit 5. On the other hand, when the control signal S is at a low level, the reference current generation circuit 11 sets the reference current I1 to 0 A and the reference current I2 to 0 A.

The high level of the control signal S corresponds to a "first value" in this disclosure. The low level of the control signal S corresponds to a "second value" in this disclosure.

The reference current generation circuit 11 can be constituted, for example, by a current source and a current-mirror connected MOSFET (Metal-Oxide-Semiconductor Field-Effect Transistor). The external circuit is, for example, a CPU (Central Processing Unit), but it is not limited to such an example. The external circuit can operate the power amplifier 1 by outputting the control signal S at the high level to the reference current generation circuit 11. On the other hand, the external circuit can stop (cut off or shut down) the power amplifier 1 by outputting the control signal S at the low level to the reference current generation circuit 11. Thus, the external circuit can control the operation and stoppage (cutoff or shutdown) of the power amplifier 1 depending on the control signal S.

The initial-stage bias circuit 4 generates a bias voltage corresponding to the reference current I1 outputted from the reference current generation circuit 11, and outputs the generated bias voltage to the initial-stage amplifier circuit 2. The output-stage bias circuit 5 generates a bias voltage corresponding to the reference current I2 outputted from the reference current generation circuit 11, and outputs the generated bias voltage to the output-stage amplifier circuit 3.

Figure 2:
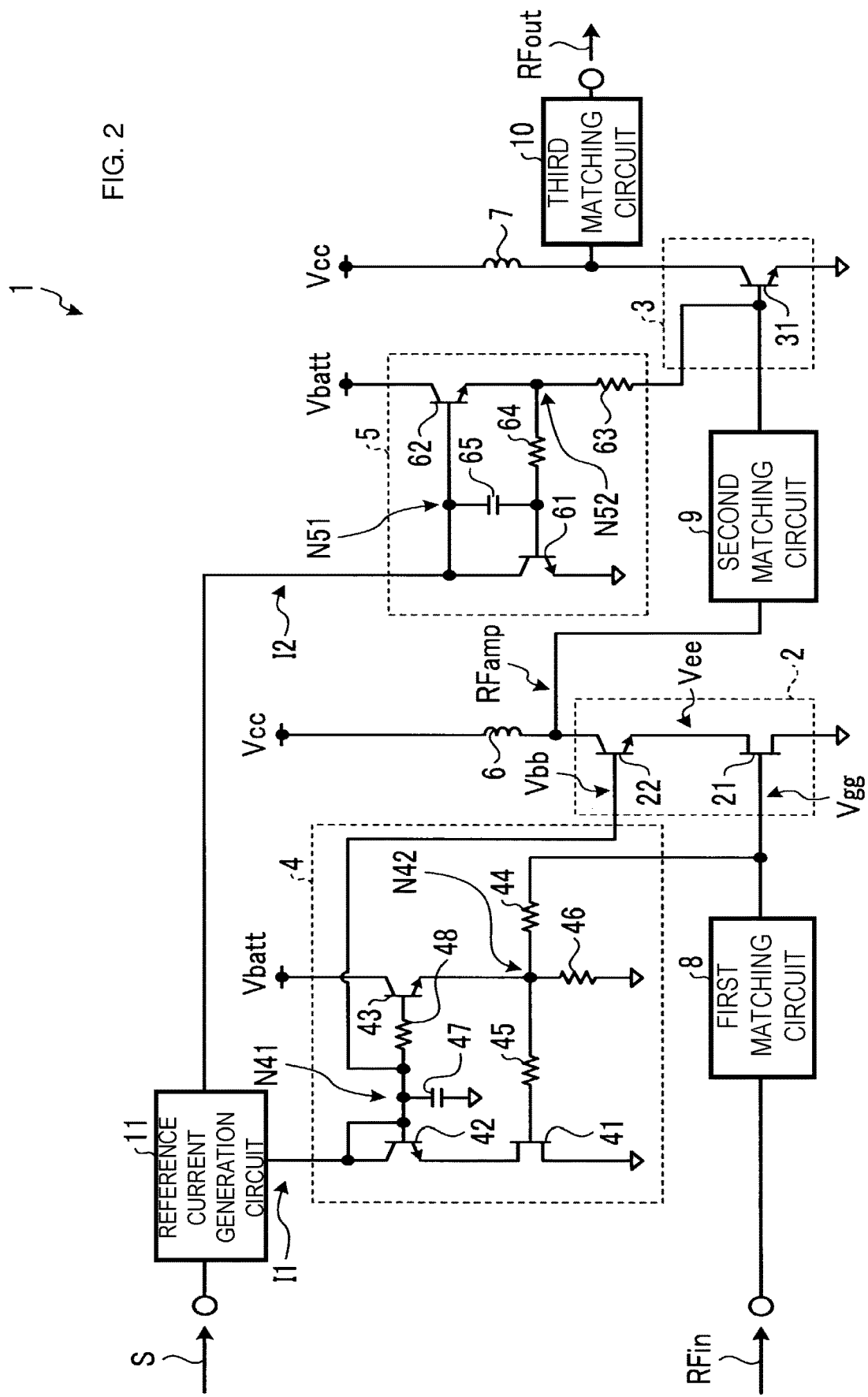
FIG. 2 is a circuit diagram of the power amplifier according to the first embodiment.

FIG. 2 is a circuit diagram of the power amplifier according to the first embodiment of the present disclosure.

The initial-stage amplifier circuit 2 includes an enhancement-type High Electron Mobility Transistor (HEMT) 21, and a Heterojunction Bipolar Transistor (HBT) 22. In the following description, a High Electron Mobility Transistor is called a "HEMT", and a Heterojunction Bipolar Transistor is called a "HBT".

The HEMT 21 corresponds to a "first high electron mobility transistor" in this disclosure. The HBT 22 corresponds to a "first heterojunction bipolar transistor" in this disclosure.

In the first embodiment, the HEMT may be a multi-finger HEMT in which unit transistors are electrically connected in parallel. The HBT may be a multi-finger HBT in which unit transistors are electrically connected in parallel.

A source of the HEMT 21 is connected to a reference potential. The reference potential is, for example, a ground potential, but it is not limited to such an example. The bias voltage from the initial-stage bias circuit 4 is inputted to a gate of the HEMT 21. A drain of the HEMT 21 is connected to an emitter of the HBT 22. In other words, the HEMT 21 is a source grounded circuit.

The emitter of the HBT 22 is connected to the drain of the HEMT 21. The bias voltage from the initial-stage bias circuit 4 is inputted to a base of the HBT 22. A collector of the HBT 22 is connected to the power supply potential Vcc via the choke inductor 6. As described later, the base of the HBT 22 is grounded in an alternate-current fashion by the initial-stage bias circuit 4. In other words, the HBT 22 is a base grounded circuit.

As described above, the source of the HEMT 21 is connected to the reference potential, the drain of the HEMT 21 is connected to the emitter of the HBT 22, and the collector of the HBT 22 is connected to the power supply potential Vcc via the choke inductor 6. In other words, the HEMT 21 and the HBT 22 constitute a cascode connected circuit.

The output-stage amplifier circuit 3 includes a HBT 31. An emitter of the HBT 31 is connected to the reference potential. The bias voltage from the output-stage bias circuit 5 is inputted to a base of the HBT 31. A collector of the HBT 31 is connected to the power supply potential Vcc via the choke inductor 7. In other words, the HBT 31 is an emitter grounded circuit.

The HBT 31 corresponds to a "second heterojunction bipolar transistor" in this disclosure.

The radio-frequency input signal RFin is inputted to the gate of the HEMT 21 after passing through the first matching circuit 8. The HEMT 21 and the HBT 22 output the radio-frequency signal RFamp, which is resulted from amplifying the radio-frequency input signal RFin, to the second matching circuit 9 from the collector of the HBT 22. The radio-frequency signal RFamp is inputted to the base of the HBT 31 after passing through the second matching circuit 9. The HBT 31 outputs the radio-frequency output signal RFout, which is resulted from amplifying the radio-frequency signal RFamp, from the collector of the HBT 31.

The initial-stage bias circuit 4 includes a HEMT 41, HBTs 42 and 43, resistances 44, 45, 46 and 48, and a capacitor 47.

A source of the HEMT 41 is connected to the reference potential. A gate of the HEMT 41 is connected to a node N42 via the resistance 45. A drain of the HEMT 41 is connected to an emitter of the HBT 42. A base and a collector of the HBT 42 are connected to a node N41.

The node N41 corresponds to a "first node" in this disclosure. The node N42 corresponds to a "second node" in this disclosure. The HEMT 41 corresponds to a "second high electron mobility transistor" in this disclosure. The HBT 42 corresponds to a "third heterojunction bipolar transistor" in this disclosure.

One end of the resistance 48 is connected to the node N41. The other end of the resistance 48 is connected to a base of the HBT 43. A collector of the HBT 43 is connected to a power supply potential Vbatt. The power supply potential Vbatt may be the same as or different from the power supply potential Vcc. An emitter of the HBT 43 is connected to the node N42.

The HBT 43 corresponds to a "fourth heterojunction bipolar transistor" in this disclosure.

One end of the resistance 44, one end of the resistance 45, and one end of the resistance 46 are connected to the node N42. The other end of the resistance 44 is connected to the gate of the HEMT 21. The other end of the resistance 45 is connected to the gate of the HEMT 41. The other end of the resistance 46 is connected to the reference potential. The resistance 46 causes an emitter current of the HBT 43 to flow toward the reference potential.

The resistance 44 corresponds to a "first resistance" in this disclosure. The resistance 45 corresponds to a "second resistance" in this disclosure. The resistance 46 corresponds to a "third resistance" in this disclosure.

The reference current generation circuit 11 outputs the reference current I1 to the node N41. Thus, the sum of an emitter current of the HBT 42, a base current of the HBT 43, and a base current of the HBT 22 is the reference current I1.

A base voltage of the HBT 43 is a voltage resulting from subtracting a voltage drop caused by the resistance 48 from a voltage at the node N41. The HBT 43 operates as an emitter follower circuit with an emitter output. The emitter follower circuit operates to hold a base-emitter voltage constant. Accordingly, a voltage of the node N42 is held constant. Hence a gate voltage of the HEMT 21 is held constant. Similarly, a gate voltage of the HEMT 41 is also held constant. The gate voltage of the HEMT 41 can be adjusted because the voltage drop caused by the resistance 48 can be adjusted by adjusting a resistance value of the resistance 48.

The following description is made about the case in which sizes and characteristics of the HEMTs 21 and 41 are the same, and in which sizes and characteristics of the HBTs 22 and 42 are the same. In practice, the size and the characteristics of the HEMT 21 can be made different from the size and the characteristics of the HEMT 41 in order to adjust the bias voltage of the HEMT 21 and the bias voltage of the HBT 22. Similarly, the size and the characteristics of the HBT 22 can be made different from the size and the characteristics of the HBT 42.

The voltage at the node N41 is inputted to the base of the HBT 22 and to the base and the collector of the HBT 42. The voltage at the node N41 is the sum of a voltage drop between the collector and the emitter of the HBT 42 and a voltage drop between the drain and the source of the HEMT 41. Furthermore, a voltage at the node N42 is inputted to the gate of the HEMT 21 and the gate of the HEMT 41. The voltage at the node N42 is a voltage resulting from subtracting the voltage drop caused by the resistance 48 and a voltage drop between the base and the emitter of the HBT 43 from the voltage at the node N41.

Thus, the pair of HEMT 21 and HBT 22 and the pair of HEMT 41 and HBT 42 have a circuit configuration similar to that of a cascode current mirror circuit. Therefore, an emitter current of the HBT 22, i.e., a drain current of the HEMT 21, is the same as an emitter current of the HBT 42, i.e., a drain current of the HEMT 41. As a result, the initial-stage bias circuit 4 can set an operating point of the initial-stage amplifier circuit 2. In practice, the operating point of the initial-stage amplifier circuit 2 can be adjusted by making the size and the characteristics different between the HEMT 21 and the HEMT 41, or by making the size and the characteristics different between the HBT 22 and the HBT 42.

One end of the capacitor 47 is connected to the node N41. The other end of the capacitor 47 is connected to the reference potential. The capacitor 47 suppresses the voltage variations in the initial-stage bias circuit 4, which are caused by mixing of the radio-frequency input signal RFin into the initial-stage bias circuit 4. Thus, the capacitor 47 can stabilize the operation of the initial-stage amplifier circuit 2.

The initial-stage bias circuit 4 can stabilize the bias voltage at the gate of the HEMT 21 and the bias voltage at the base of the HBT 22. Accordingly, the power amplifier 1 can perform stable amplification.

The output-stage bias circuit 5 includes HBTs 61 and 62, resistances 63 and 64, and a capacitor 65.

An emitter of the HBT 61 is connected to the reference potential. A base of the HBT 61 is connected to a node N52 via the resistance 64. A collector of the HBT 61 is connected to the node N51.

A base of the HBT 62 is connected to the node N51. A collector of the HBT 62 is connected to the power supply potential Vbatt. An emitter of the HBT 62 is connected to the node N52.

One end of the resistance 63 and one end of the resistance 64 are connected to the node N52. The other end of the resistance 63 is connected to the base of the HBT 31. The other end of the resistance 64 is connected to the base of the HBT 61.

The reference current generation circuit 11 outputs the reference current I2 to the node N51. The sum of a collector current of the HBT 61 and a base current of the HBT 62 is the reference current I2.

The HBT 62 operates as an emitter follower circuit with an emitter output. Accordingly, a base voltage of the HBT 31 is held constant. Similarly, a base voltage of the HBT 61 is also held constant.

The following description is made about the case in which sizes and characteristics of the HBTs 31 and 61 are the same. In practice, the size and the characteristics of the HBT 31 can be made different from the size and the characteristics of the HBT 61 in order to adjust the bias voltage of the HBT 31.

A voltage at the node N52 is inputted to the base of the HBT 31 and the base of the HBT 61. The voltage at the node N52 is a voltage resulting from subtracting a voltage drop between the collector and the emitter of the HBT 62 from the power supply potential Vbatt.

Thus, the HBT 31 and the HBT 61 have a circuit configuration similar to that of a current mirror circuit. Therefore, an emitter current of the HBT 31 is the same as an emitter current of the HBT 61. As a result, the output-stage bias circuit 5 can set an operating point of the output-stage amplifier circuit 3. In practice, the operating point of the output-stage amplifier circuit 3 can be adjusted by making the size and the characteristics different between the HBT 31 and the HBT 61.

The capacitor 65 is connected between the base of the HBT 61 and the node N51. The capacitor 65 suppresses voltage variations in the output-stage bias circuit 5, which are caused by mixing of the radio-frequency signal RFamp into the output-stage bias circuit 5. Thus, the capacitor 65 can stabilize the operation of the output-stage amplifier circuit 3.

The operation of the initial-stage amplifier circuit 2 when the control signal S supplied from the external circuit is at the high level, namely when the reference current generation circuit 11 outputs the positive and constant reference current I1 to the initial-stage bias circuit 4, will be described below.

Because the HEMT 21 is the source grounded circuit, it performs inverting amplification. Therefore, the Miller effect may generate in the HEMT 21. Thus, assuming a voltage amplification rate of the HEMT 21 to be $A_{21}$, an electrostatic capacity between the gate and the drain of the HEMT 21 may increase $(1+A_{21})$ times. However, the emitter of the HBT 22 is connected to the drain of the HEMT 21. In addition, the HBT 22 is the base grounded circuit. Hence the HBT 22 operates such that the base-emitter voltage is held constant. As a result, the drain voltage of the HEMT 21 is suppressed to the emitter voltage of the HBT 22. In other words, the voltage amplification rate $A_{21}$ of the HEMT 21 is suppressed. Thus, an increase of the electrostatic capacity between the gate and the drain of the HEMT 21 is suppressed. Consequently, the Miller effect of the HEMT 21 is suppressed. Moreover, because the HBT 22 is the base grounded circuit, it performs non-inverting amplification. Therefore, the Miller effect in the HBT 22 is suppressed.

Accordingly, a cutoff frequency of the initial-stage amplifier circuit 2 becomes higher. In other words, the initial-stage amplifier circuit 2 can perform linear amplification up to a higher frequency. Thus, the initial-stage amplifier circuit 2 is suitable for the amplification of the radio-frequency input signal RFin.

Assuming a mutual conductance of the HEMT 21 to be $g_m$ and the gate voltage of the HEMT 21 to be $V_{gg}$, a drain-source current Ids of the HEMT 21 is given by $Ids=g_m \cdot V_{gg}$. On the other hand, as described above, the drain voltage of the HEMT 21 is suppressed to the emitter voltage of the HBT 22. Accordingly, the voltage amplification rate $A_{21}$ of the HEMT 21 is suppressed. The voltage amplification rate $A_{21}$ of the HEMT 21 is, for example, about 1, but it is not limited to such an example.

The HBT 22 is the base grounded circuit. In general, a current amplification rate a of the base grounded circuit is about 0.99. Furthermore, a voltage amplification rate of the base grounded circuit is high as in the emitter grounded circuit. Moreover, since the HEMT 21 and the HBT 22 are cascode-connected, an output impedance of the initial-stage amplifier circuit 2 is high.

As a result, a power gain of the initial-stage amplifier circuit 2 can be increased.

Restrictions on voltage conditions of the HEMT 21 and the HBT 22 when the radio-frequency input signal RFin has maximum power are as follows. It is here assumed that a threshold voltage of the HEMT 21 is denoted by Vth, a threshold voltage of the HBT 22 is denoted by Von, the gate voltage of the HEMT 21 is denoted by Vgg, the drain voltage of the HEMT 21, i.e., the emitter voltage of the HBT 22, is denoted by Vee, and the base voltage of the HBT 22 is denoted by Vbb.

The following formula (1) is preferably held for the HEMT 21 to perform the amplification operation.

$$Vth \leq Vgg \qquad (1)$$

The following formula (2) is preferably held for the HBT 22 to perform the amplification operation.

$$Von+Vee \leq Vbb \qquad (2)$$

The following formula (3) is preferably held for the HEMT 21 to perform the amplification operation while suppressing generation of the Miller effect in the HEMT 21.

$$Vth \leq Vee \leq 2 \cdot Vth \qquad (3)$$

The operation of the initial-stage amplifier circuit 2 when the control signal S supplied from the external circuit is at the low level, namely when the reference current generation circuit 11 sets the reference current I1 to 0 A, will be described below.

When the reference current I1 is 0 A, each of the potentials at the nodes N41 and N42 naturally drops down to the reference potential. In other words, the base voltage of the HBT 22 becomes 0 V. Accordingly, the HBT 22 is brought into a cutoff region in which the emitter current does not flow, and it is shut down. The gate voltage of the HEMT 21 also becomes 0 V. As described above, in the HEMT 21, even when the gate voltage is 0 V, a drain current Idss may flow in a non-negligible amount (e.g., about $1 \times 10^{-6}$ A). However, since the HBT 22 is brought into the cutoff region and is shut down, the drain current Idss does not flow in the HEMT 21.

Thus, in the initial-stage amplifier circuit 2, the emitter current of the HBT 22, i.e., the drain current of the HEMT 21, can be suppressed from flowing wastefully, whereby the power consumption can be suppressed.

As other patterns of the cascode-connected circuit, three patterns are conceivable, namely (1) HBT on the reference potential side and HBT on the higher potential side, (2) HEMT on the reference potential side and HEMT on the higher potential side, and (3) HBT on the reference potential side and HEMT on the higher potential side.

Regarding the above pattern (1), however, the HBT has larger operating noise and a lower gain than the HEMT. In the above pattern (1), therefore, the power gain is smaller than that in the initial-stage amplifier circuit 2 according to the first embodiment.

In the above pattern (2), even when the gate voltage of the HEMT is 0 V, the drain current flows in a non-negligible amount, and the power consumption is larger than that in the initial-stage amplifier circuit 2 according to the first embodiment.

In the above pattern (3), as in the above pattern (1), the power gain is smaller than that in the initial-stage amplifier circuit 2 according to the first embodiment.

Thus, the pattern used in the initial-stage amplifier circuit 2 according to the first embodiment, i.e., the pattern in which the HEMT is positioned on the reference potential side and the HBT is positioned on the higher potential side, is preferable for the reason that the power gain can be increased and the power consumption can be suppressed.

While, in the first embodiment, the HEMT 21 is described as being of the enhancement type, the present disclosure is not limited such a case. The HEMT 21 may be of the depletion type. In the depletion type HEMT, a gate threshold voltage is negative. Accordingly, even when the gate voltage Vgg of the HEMT 21 is set to 0 V, the HEMT 21 cannot be cut off (shut down). However, the HBT 22 can be cut off (shut down) by setting the base voltage Vbb to 0 V.

Thus, even in the case of the HEMT 21 being of the depletion type, the drain current can be suppressed from flowing wastefully in the HEMT 21. As a result, the power consumption of the power amplifier 1 can be suppressed.

Furthermore, the depletion type HEMT can cause the drain current to flow in a larger amount than the enhancement type HEMT when the same gate voltage is applied.

By using the HEMT 21 of the depletion type, therefore, the power gain of the initial-stage amplifier circuit 2 can be increased in comparison with the case of the HEMT 21 being of the enhancement type. Thus, the power gain of the power amplifier 1 can be increased in the same size. As a result, the size and the cost of the power amplifier 1 can be reduced.

The power amplifier 1 can operate only with a positive power supply and can eliminate a negative power supply. Moreover, the power amplifier 1 can increase the power gain. Hence the power amplifier 1 can realize not only the reduction of the size, but also the reduction of the cost.

Second Embodiment

Figure 3:
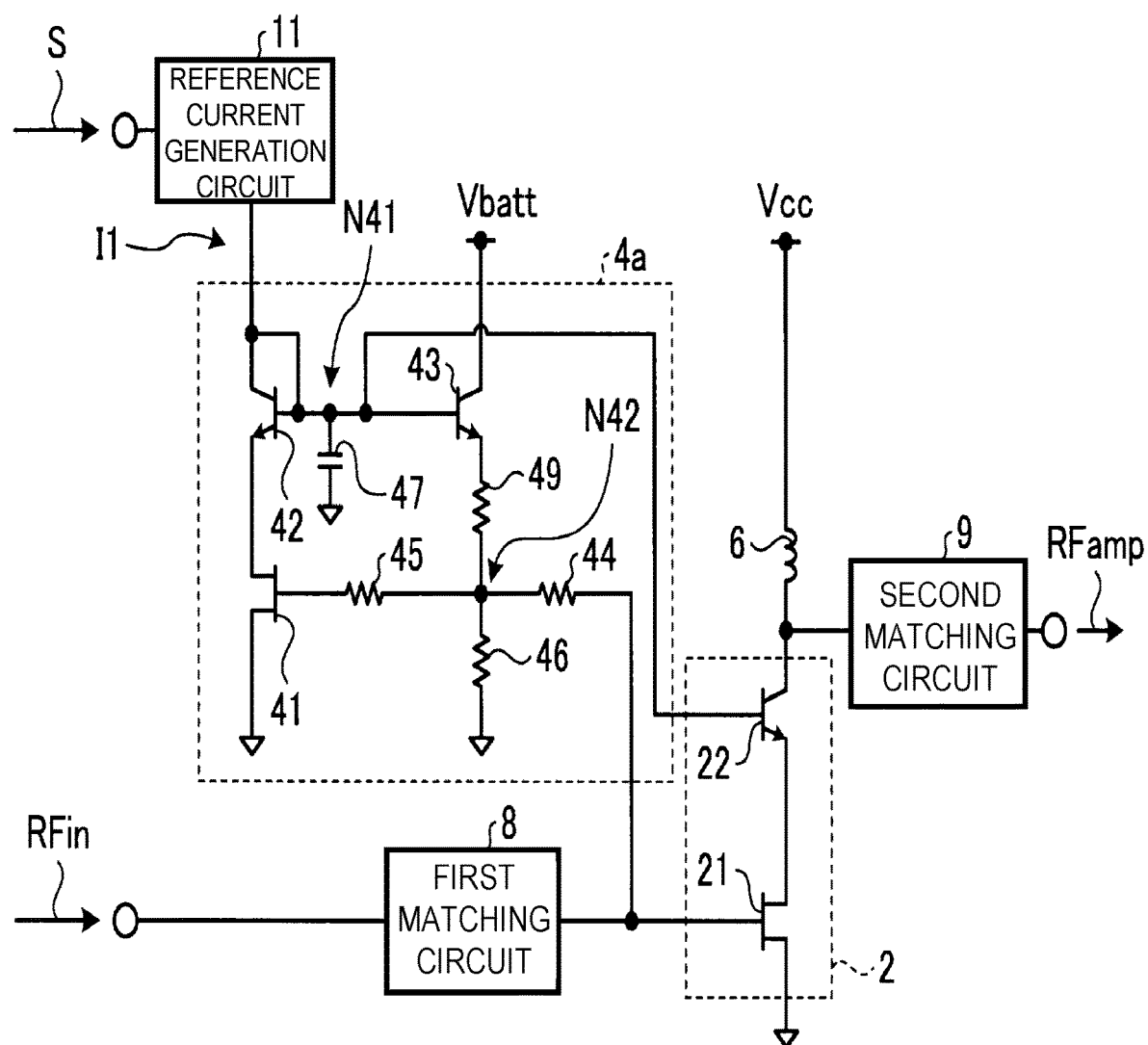
FIG. 3 is a circuit diagram of an initial-stage bias circuit in a power amplifier according to a second embodiment.

FIG. 3 is a circuit diagram of an initial-stage bias circuit 4a in a power amplifier according to a second embodiment of the present disclosure. The same constituent elements as those in the first embodiment are denoted by the same reference signs, and description of those constituent elements is omitted.

In comparison with the initial-stage bias circuit 4 in the power amplifier 1 according to the first embodiment, the initial-stage bias circuit 4a includes a resistance 49 instead of the resistance 48 (see FIG. 2). One end of the resistance 49 is connected to the emitter of the HBT 43. The other end of the resistance 49 is connected to the node N42.

In the initial-stage bias circuit 4, the voltage at the node N42 is a voltage resulting from subtracting both the voltage drop caused by the resistance 48 and the voltage drop between the base and the emitter of the HBT 43 from the voltage at the node N41. Thus, the gate voltage of the HEMT 21 can be adjusted by adjusting the resistance value of the resistance 48.

In the initial-stage bias circuit 4a, the voltage at the node N42 is a voltage resulting from subtracting both the voltage drop between the base and the emitter of the HBT 43 and a voltage drop caused by the resistance 49 from the voltage at the node N41.

Thus, the bias voltage at the gate of the HEMT 21 can be adjusted by adjusting the resistance value of the resistance 49. As a result, the initial-stage amplifier circuit 2 can adjust the power gain.

In the initial-stage bias circuit 4, the resistance 48 is connected to the base of the HBT 43. Therefore, a contribution of the resistance value of the resistance 48 to the bias voltage at the gate of the HEMT 21 is affected by individual differences (variations) of a DC current gain $h_{FE}$ of the HBT 43. Thus, the voltage at the node N42 is greatly affected by the individual differences (variations) of the DC current gain $h_{FE}$ of the HBT 43.

On the other hand, in the initial-stage bias circuit 4a, the resistance 49 is connected to the emitter of the HBT 43. Therefore, a contribution of the resistance value of the resistance 49 to the bias voltage at the gate of the HEMT 21 is not affected by the individual differences (variations) of the DC current gain $h_{FE}$ of the HBT 43. Thus, the voltage at the node N42 is less affected by the individual differences (variations) of the DC current gain $h_{FE}$ of the HBT 43.

As a result, the initial-stage bias circuit 4a can further stabilize the operation of the initial-stage amplifier circuit 2 in comparison with the initial-stage bias circuit 4.

The resistance value of the resistance 49 is preferably set to be $1/h_{FE}$ time the resistance value of the resistance 48.

Third Embodiment

Figure 4:
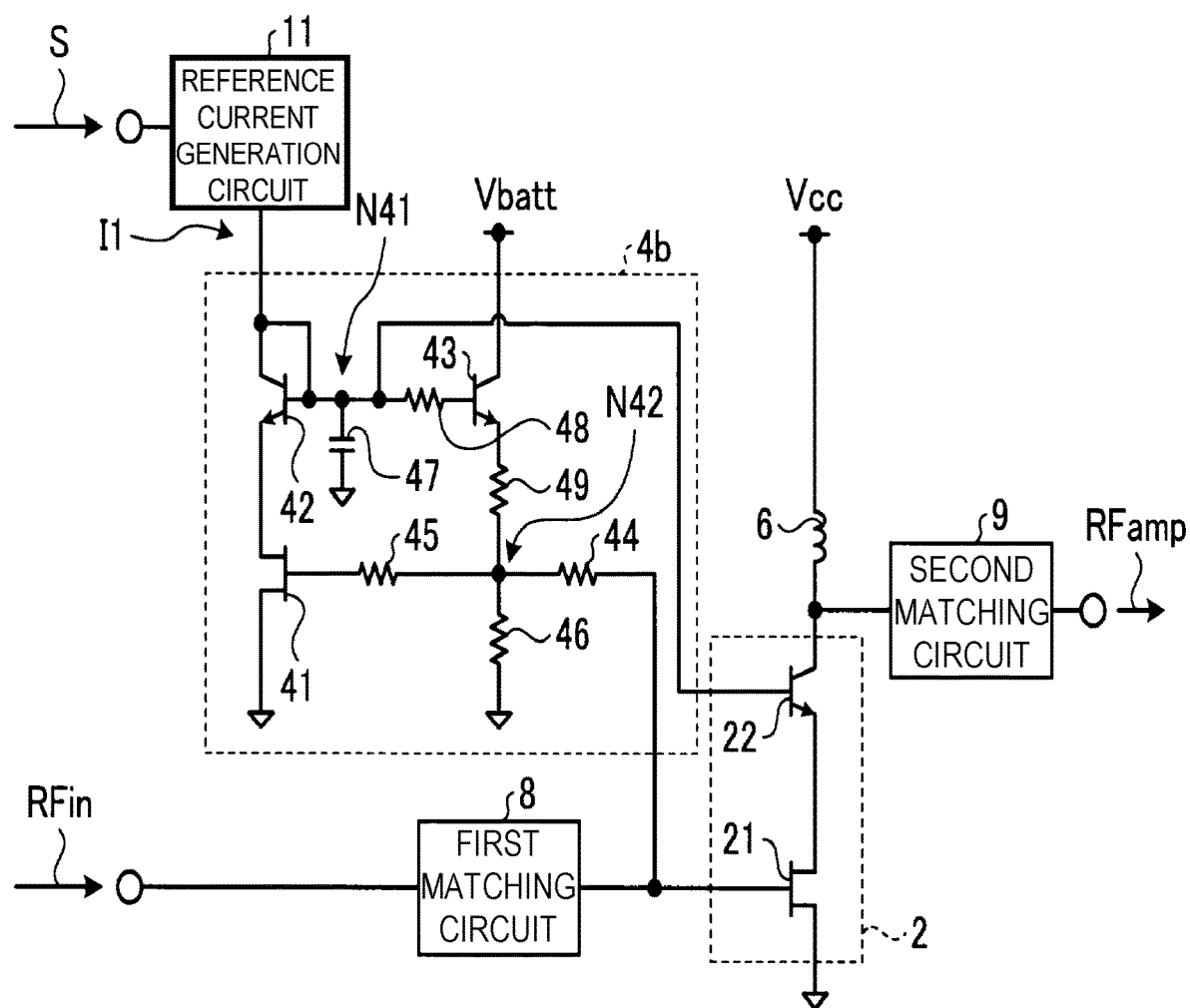
FIG. 4 is a circuit diagram of an initial-stage bias circuit in a power amplifier according to a third embodiment.

FIG. 4 is a circuit diagram of an initial-stage bias circuit 4b in a power amplifier according to a third embodiment of the present disclosure. The same constituent elements as those in the first embodiment are denoted by the same reference signs, and description of those constituent elements is omitted.

In comparison with the initial-stage bias circuit 4 in the power amplifier 1 according to the first embodiment, the initial-stage bias circuit 4b further includes a resistance 49 in addition to the resistance 48. One end of the resistance 49 is connected to the emitter of the HBT 43. The other end of the resistance 49 is connected to the node N42.

In the initial-stage bias circuit 4b, the voltage at the node N42 is a voltage resulting from subtracting the voltage drop caused by the resistance 48, the voltage drop between the base and the emitter of the HBT 43, a voltage drop caused by the resistance 49 from the voltage at the node N41. Thus, the gate voltage of the HEMT 21 can be adjusted by adjusting the resistance value of the resistance 48 or the resistance 49.

As seen from the initial-stage bias circuit 4 (see FIG. 2) according to the first embodiment, the initial-stage bias circuit 4a (see FIG. 3) according to the second embodiment, and the initial-stage bias circuit 4b (see FIG. 4) according to the third embodiment, a resistance is preferably connected to at least one of positions between the base of the HBT 43 and the node N41 and between the emitter of the HBT 43 and the node N42.

Fourth Embodiment

Figure 5:
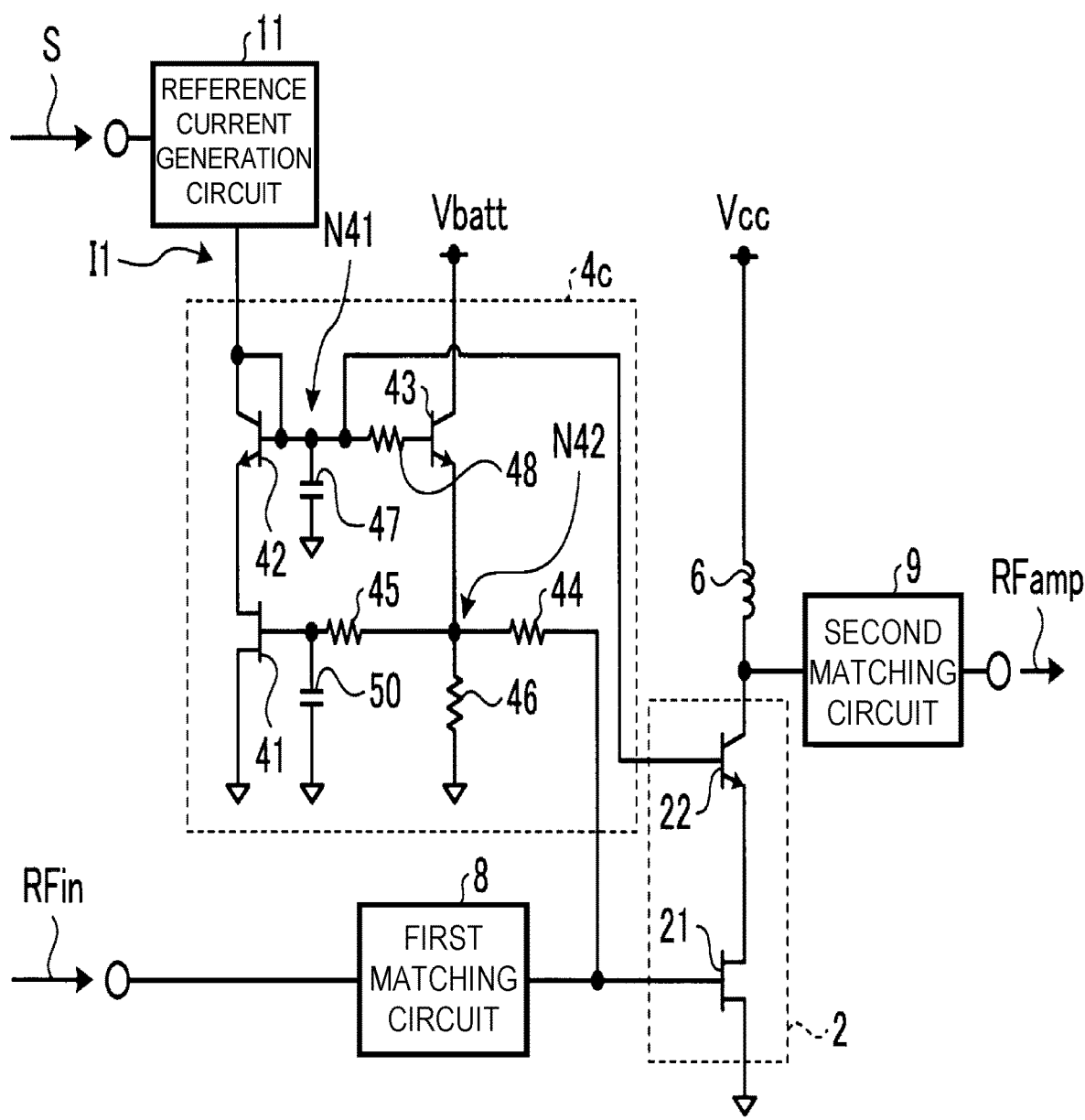
FIG. 5 is a circuit diagram of an initial-stage bias circuit in a power amplifier according to a fourth embodiment.

FIG. 5 is a circuit diagram of an initial-stage bias circuit 4c in a power amplifier according to a fourth embodiment of the present disclosure. The same constituent elements as those in the first embodiment are denoted by the same reference signs, and description of those constituent elements is omitted.

In comparison with the initial-stage bias circuit 4 in the first embodiment, the initial-stage bias circuit 4c further includes a capacitor 50. One end of capacitor 50 is connected to the gate of the HEMT 41. The other end of the capacitor 50 is connected to the reference potential.

The capacitor 50 further suppresses, in addition to the capacitor 47, the voltage variations in the initial-stage bias circuit 4c, which are caused by mixing of the radio-frequency input signal RFin into the initial-stage bias circuit 4c.

Accordingly, the initial-stage bias circuit 4c can further stabilize the operation of the initial-stage amplifier circuit 2 in comparison with the initial-stage bias circuit 4.

The capacitor 47 may be omitted in exchange for adding the capacitor 50. Even in such a case, the capacitor 50 can stabilize the operation of the initial-stage amplifier circuit 2.

Furthermore, the fourth embodiment may be combined with the second and third embodiments. More specifically, in the initial-stage bias circuit 4a (see FIG. 3) according to the second embodiment, the capacitor 50 may be disposed between the gate of the HEMT 41 and the reference potential. Similarly, in the initial-stage bias circuit 4b (see FIG. 4) according to the third embodiment, the capacitor 50 may be disposed between the gate of the HEMT 41 and the reference potential. Also in such a case, the capacitor 47 may be omitted in exchange for adding the capacitor 50.

Fifth Embodiment

Figure 6:
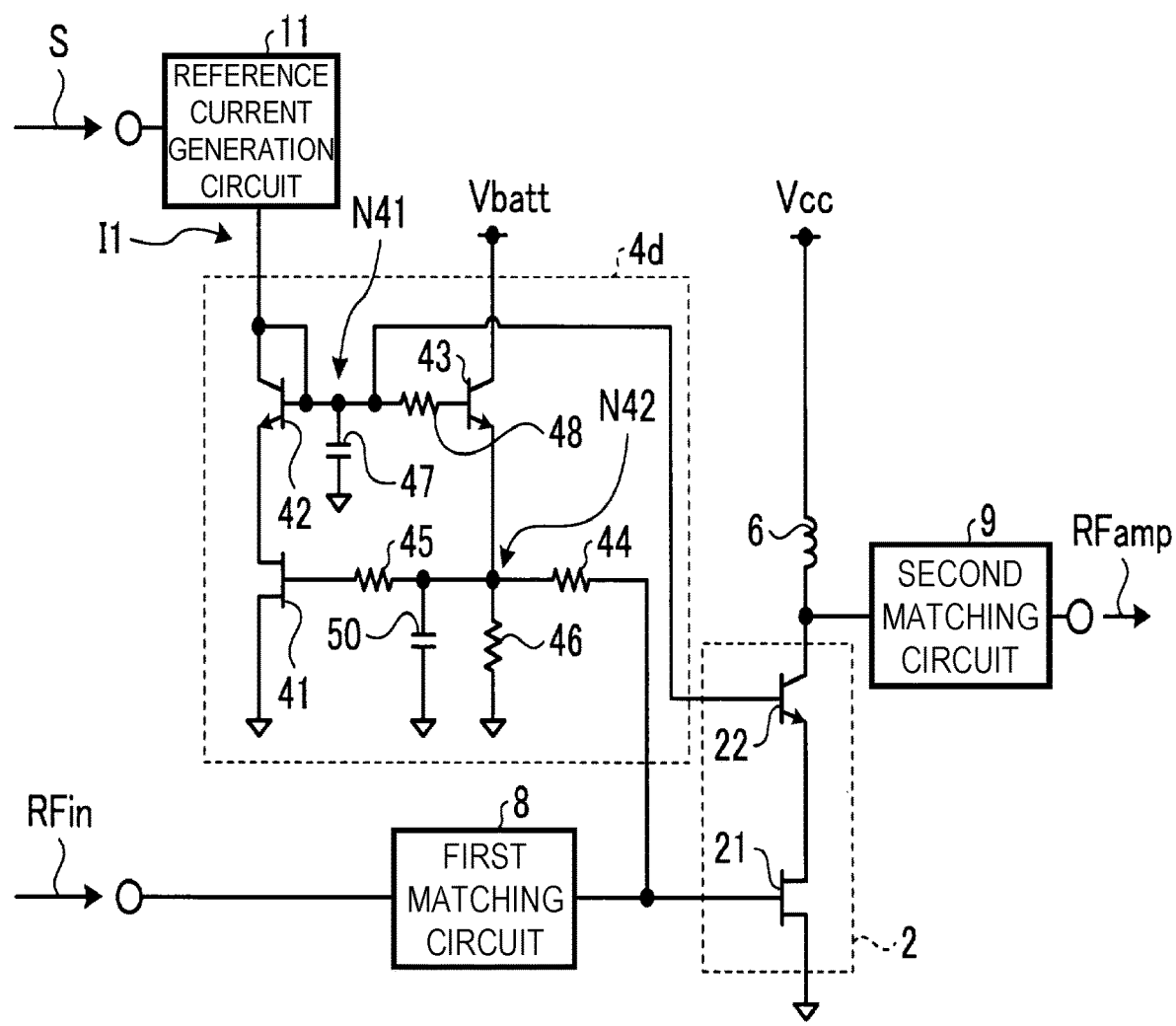
FIG. 6 is a circuit diagram of an initial-stage bias circuit in a power amplifier according to a fifth embodiment.

FIG. 6 is a circuit diagram of an initial-stage bias circuit 4d in a power amplifier according to a fifth embodiment of the present disclosure. The same constituent elements as those in the first embodiment are denoted by the same reference signs, and description of those constituent elements is omitted.

In comparison with the initial-stage bias circuit 4 in the power amplifier 1 according to the first embodiment, the initial-stage bias circuit 4d further includes a capacitor 50. One end of the capacitor 50 is connected to the node N42. The other end of the capacitor 50 is connected to the reference potential.

The capacitor 50 further suppresses, in addition to the capacitor 47, the voltage variations in the initial-stage bias circuit 4d, which are caused by mixing of the radio-frequency input signal RFin into the initial-stage bias circuit 4d.

Accordingly, the initial-stage bias circuit 4d can further stabilize the operation of the initial-stage amplifier circuit 2 in comparison with the initial-stage bias circuit 4.

The capacitor 47 may be omitted in exchange for adding the capacitor 50. Even in such a case, the capacitor 50 can stabilize the operation of the initial-stage amplifier circuit 2.

It is hence preferable that a capacitor is electrically connected to at least one of positions between the node N41 and the reference potential, between the gate of the HEMT 41 and the reference potential, and between the node N42 and the reference potential.

Furthermore, the fifth embodiment may be combined with the second and third embodiments. More specifically, in the initial-stage bias circuit 4a (see FIG. 3) according to the second embodiment, the capacitor 50 may be disposed between the node N42 and the reference potential. Similarly, in the initial-stage bias circuit 4b (see FIG. 4) according to the third embodiment, the capacitor 50 may be disposed between the node N42 and the reference potential. Also in such a case, the capacitor 47 may be omitted in exchange for adding the capacitor 50.

Sixth Embodiment

Figure 7:
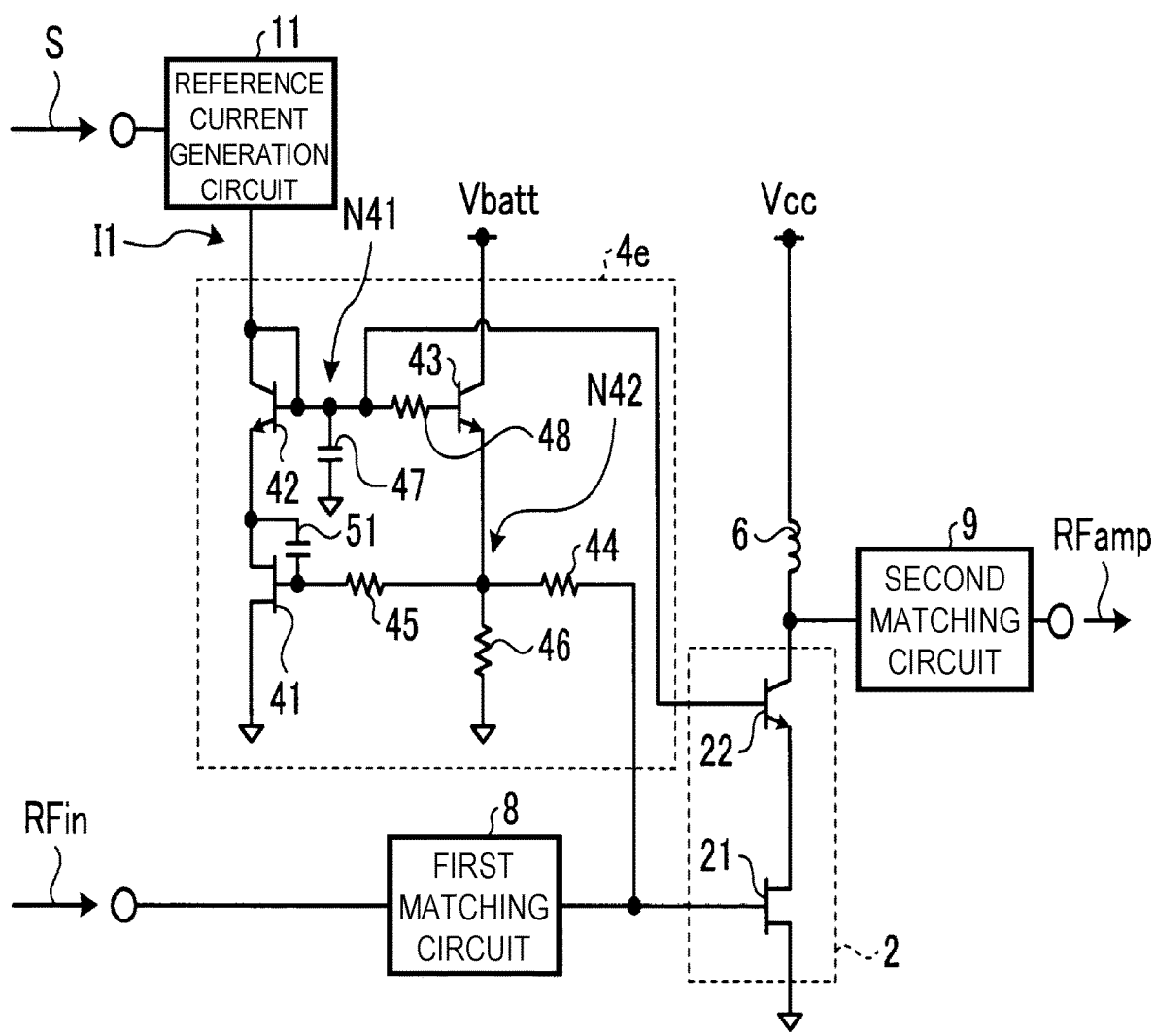
FIG. 7 is a circuit diagram of an initial-stage bias circuit in a power amplifier according to a sixth embodiment.

FIG. 7 is a circuit diagram of an initial-stage bias circuit 4e in a power amplifier according to a sixth embodiment of the present disclosure. The same constituent elements as those in the first embodiment are denoted by the same reference signs, and description of those constituent elements is omitted.

In comparison with the initial-stage bias circuit 4 in the power amplifier 1 according to the first embodiment, the initial-stage bias circuit 4e further includes a capacitor 51. One end of the capacitor 51 is connected to the gate of the HEMT 41. The other end of the capacitor 51 is connected to the drain of the HEMT 41.

The capacitor 51 further suppresses, in addition to the capacitor 47, the voltage variations in the initial-stage bias circuit 4e, which are caused by mixing of the radio-frequency input signal RFin into the initial-stage bias circuit 4e.

Accordingly, the initial-stage bias circuit 4e can further stabilize the operation of the initial-stage amplifier circuit 2 in comparison with the initial-stage bias circuit 4.

Figure 8:
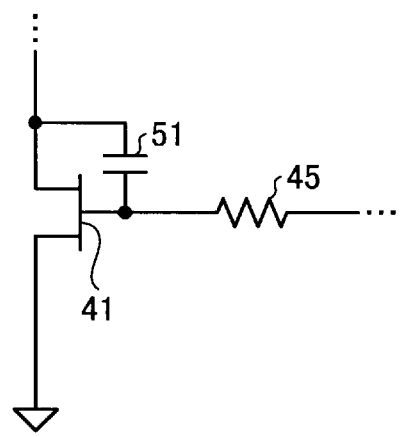
FIG. 8 is a circuit diagram of a part of the initial-stage bias circuit in the power amplifier according to the sixth embodiment.

FIG. 8 is a circuit diagram of a part of the initial-stage bias circuit in the power amplifier according to the sixth embodiment of the present disclosure. More specifically, FIG. 8 illustrates a circuit configuration of the HEMT 41, the resistance 45, and the capacitor 51 in the initial-stage bias circuit 4e.

Figure 9:
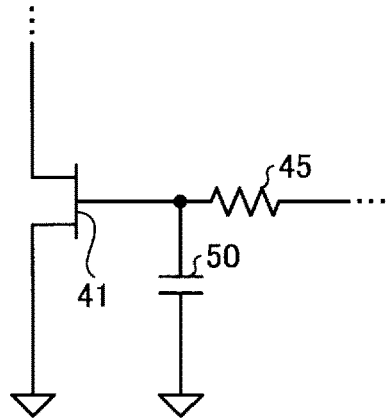
FIG. 9 is a circuit diagram of a part of the initial-stage bias circuit in the power amplifier according to the fourth embodiment.

FIG. 9 is a circuit diagram of a part of the initial-stage bias circuit in the power amplifier according to the fourth embodiment of the present disclosure. More specifically, FIG. 9 illustrates a circuit configuration of the HEMT 41, the resistance 45, and the capacitor 50 in the initial-stage bias circuit 4c.

Assuming that a voltage amplification rate of the HEMT 41 is denoted by $A_{41}$, an electrostatic capacity value of the capacitor 50 is denoted by $C_{50}$, and an electrostatic capacity value of the capacitor 51 is denoted by $C_{51}$, the circuit illustrated in FIG. 8 and the circuit illustrated in FIG. 9 can be regarded as being electrically equivalent when the following formula (4) is held. The reason is that the electrostatic capacity of the capacitor 51 is increased ($1+A_{41}$) times due to an effect similar to the Miller effect obtained with the HEMT 41.

$$C_{51} \approx C_{50}/(1+A_{41}) \tag{4}$$

Accordingly, the electrostatic capacity value of the capacitor 51 can be made smaller than that of the capacitor 50. In other words, the size of the capacitor 51 can be made smaller than that of the capacitor 50.

Thus, a geometrical area of the initial-stage bias circuit 4e can be made smaller than that of the initial-stage bias circuit 4c. As a result, the initial-stage bias circuit 4e can contribute to reducing the size of the power amplifier 1.

The capacitor 47 may be omitted in exchange for adding the capacitor 51. Even in such a case, the capacitor 51 can stabilize the operation of the initial-stage amplifier circuit 2.

Furthermore, the sixth embodiment may be combined with the second and third embodiments. More specifically, in the initial-stage bias circuit 4a (see FIG. 3) according to the second embodiment, the capacitor 51 may be disposed between the gate of the HEMT 41 and the drain of the HEMT 41. Similarly, in the initial-stage bias circuit 4b (see FIG. 4) according to the third embodiment, the capacitor 51 may be disposed between the gate of the HEMT 41 and the drain of the HEMT 41. Also in such a case, the capacitor 47 may be omitted in exchange for adding the capacitor 51.

Seventh Embodiment

Figure 10:
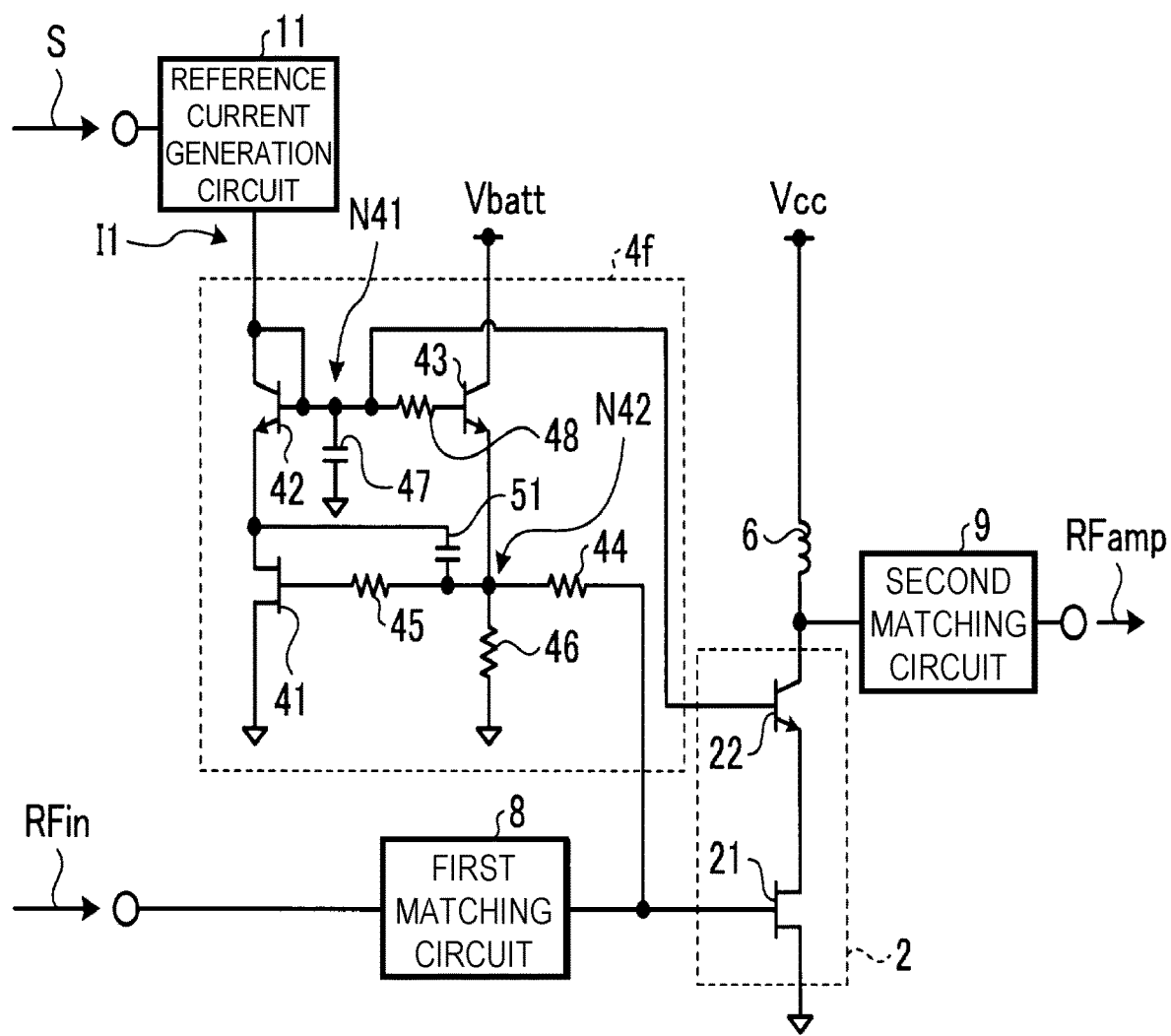
FIG. 10 is a circuit diagram of an initial-stage bias circuit in a power amplifier according to a seventh embodiment.

FIG. 10 is a circuit diagram of an initial-stage bias circuit 4f in a power amplifier according to a seventh embodiment of the present disclosure. The same constituent elements as those in the first embodiment are denoted by the same reference signs, and description of those constituent elements is omitted.

In comparison with the initial-stage bias circuit 4e in the power amplifier according to the sixth embodiment, a connection point of the capacitor 51 is different in the initial-stage bias circuit 4f. In the initial-stage bias circuit 4f, one end of the capacitor 51 is connected to the node N42. The other end of the capacitor 51 is connected to the drain of the HEMT 41.

The capacitor 51 further suppresses, in addition to the capacitor 47, the voltage variations in the initial-stage bias circuit 4f, which are caused by mixing of the radio-frequency input signal RFin into the initial-stage bias circuit 4f.

Accordingly, the initial-stage bias circuit 4f can further stabilize the operation of the initial-stage amplifier circuit 2 as with the initial-stage bias circuit 4e according to the sixth embodiment.

For the same reason described in the sixth embodiment, the electrostatic capacity value of the capacitor 51 can be made smaller than that of the capacitor 50 (see FIG. 6). In other words, the size of the capacitor 51 can be made smaller than that of the capacitor 50.

As a result, the initial-stage bias circuit 4f can contribute to reducing the size of the power amplifier 1 as with the initial-stage bias circuit 4e.

The capacitor 47 may be omitted in exchange for adding the capacitor 51. Even in such a case, the capacitor 51 can stabilize the operation of the initial-stage amplifier circuit 2.

It is hence preferable that a capacitor is electrically connected to at least one of positions between the node N41 and the reference potential, between the gate and the drain of the HEMT 41, and between the node N42 and the drain of the HEMT 41.

Furthermore, the seventh embodiment may be combined with the second and third embodiments. More specifically, in the initial-stage bias circuit 4a (see FIG. 3) according to the second embodiment, the capacitor 51 may be disposed between the drain of the HEMT 41 and the node N42. Similarly, in the initial-stage bias circuit 4b (see FIG. 4) according to the third embodiment, the capacitor 51 may be disposed between the drain of the HEMT 41 and the Node N42. Also in such a case, the capacitor 47 may be omitted in exchange for adding the capacitor 51.

Eighth Embodiment

In the initial-stage bias circuit 4 (see FIG. 2) according to the first embodiment, the HBT 22 is cut off (shut down) by utilizing the event that the potential at the node N41 naturally drops down to the reference potential when the reference current I1 becomes 0 A with the control signal S being turned to the low level. However, it may happen that the potential at the node N41 varies by the action of some factor and the HBT 22 is turned to an on-state, thus causing the emitter current of the HBT 22, i.e., the drain current of the HEMT 21, to flow. Some factor is, for example, an input of the radio-frequency input signal RFin, but it is not limited to such an example.

The eighth embodiment is intended to suppress the emitter current of the HBT 22, i.e., the drain current of the HEMT 21, from flowing even when the action of some factor occurs.

Figure 11:
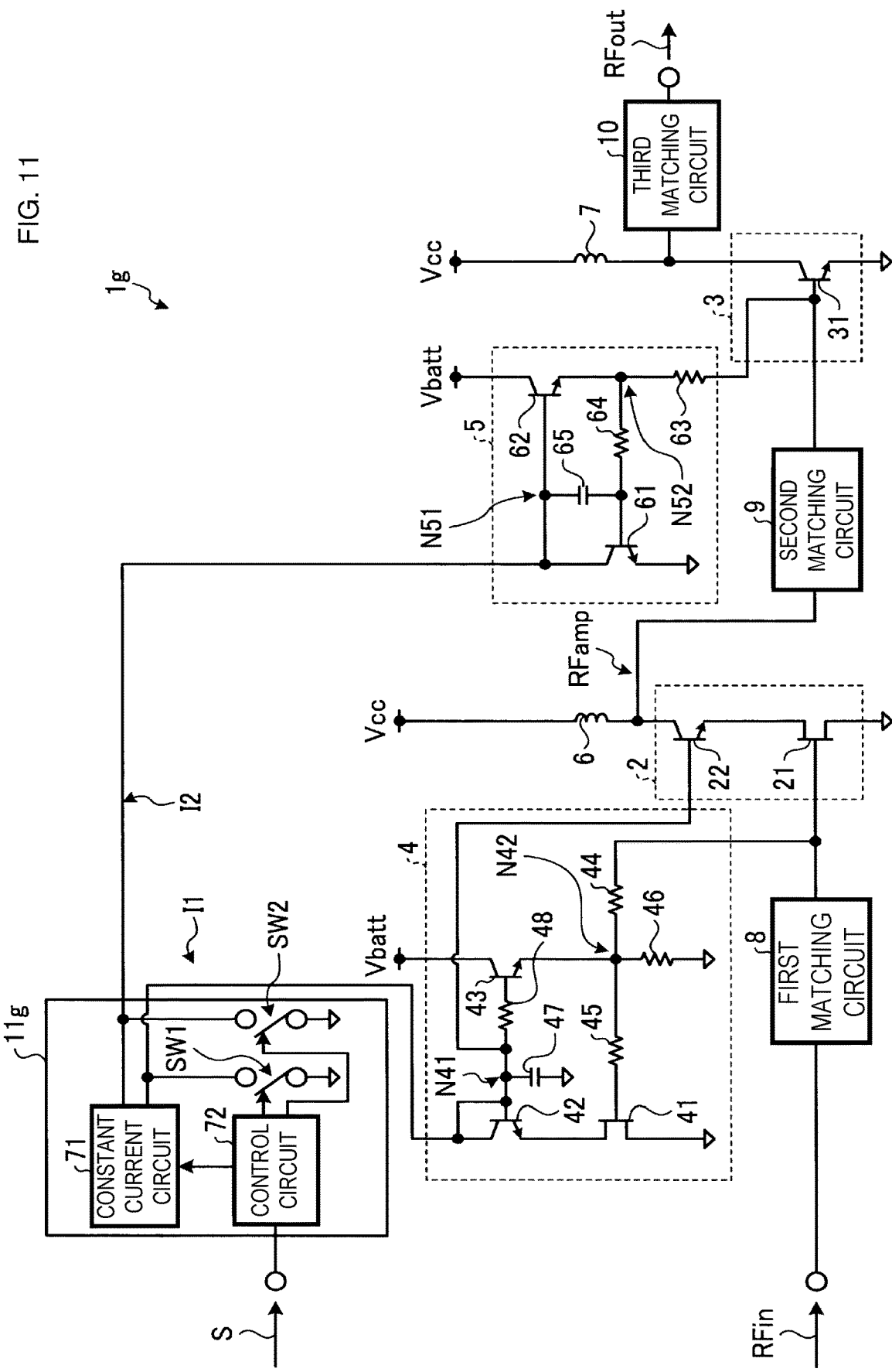
FIG. 11 is a circuit diagram of a power amplifier according to an eighth embodiment.

FIG. 11 is a circuit diagram of a power amplifier 1g according to an eighth embodiment of the present disclosure. The same constituent elements as those in the first embodiment are denoted by the same reference signs, and description of those constituent elements is omitted.

A reference current generation circuit 11g includes a constant current circuit 71, a control circuit 72, and switches SW1 and SW2. The switch SW1 is connected between a terminal of the constant current circuit 71, the terminal outputting the reference current I1, and the reference potential. The switch SW2 is connected between a terminal of the constant current circuit 71, the terminal outputting the reference current I2, and the reference potential.

The control signal S is inputted to the control circuit 72. When the control signal S is at the high level, the control circuit 72 controls the constant current circuit 71 to output the constant reference current I1 (I1>0) and the constant reference current I2 (I2>0). In addition, the control circuit 72 controls the switches SW1 and SW2 to be turned to an off-state. The reference current I1 is inputted to the initial-stage bias circuit 4. Thus, the initial-stage amplifier circuit 2 performs amplification. The reference current I2 is inputted to the output-stage bias circuit 5. Thus, the output-stage amplifier circuit 3 performs amplification.

When the control signal S is at the low level, the control circuit 72 controls the constant current circuit 71 to set both the reference current I1 and the reference current I2 to 0 A. In addition, the control circuit 72 controls the switches SW1 and SW2 to be turned to an on-state. Thus, the nodes N41 and N51 are fixedly held at the reference potential.

In the power amplifier 1g, even when the action of some factor occurs, the node N41 is fixedly held at the reference potential. Accordingly, the HBT 22 is fixedly held in the cutoff (shut down) state. As a result, the power amplifier 1g can suppress the emitter current of the HBT 22, i.e., the drain current of the HEMT 21, from flowing wastefully, and hence it can suppress the power consumption.

The eighth embodiment may be combined with the second to seventh embodiments. In other words, the reference current generation circuit 11 may be replaced with the reference current generation circuit 11g in each of the second to seventh embodiments.

Ninth Embodiment

Figure 12:
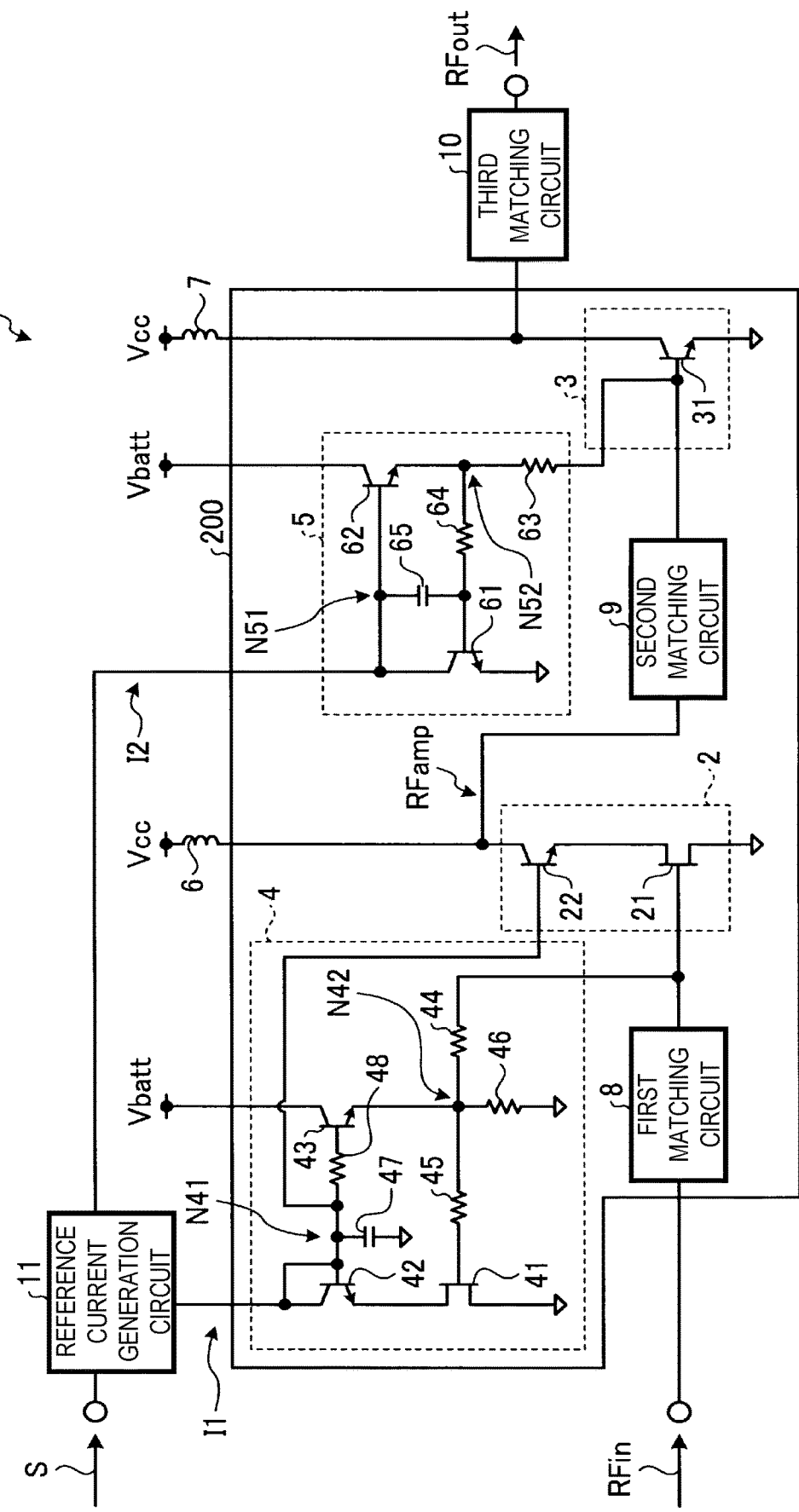
FIG. 12 is a circuit diagram of a power amplifier according to a ninth embodiment.

FIG. 12 is a circuit diagram of a power amplifier according to a ninth embodiment of the present disclosure. The same constituent elements as those in the first embodiment are denoted by the same reference signs, and description of those constituent elements is omitted.

Among the constituent elements of the power amplifier 1, the initial-stage amplifier circuit 2, the output-stage amplifier circuit 3, the initial-stage bias circuit 4, the output-stage bias circuit 5, the first matching circuit 8, and the second matching circuit 9 are formed on one compound semiconductor chip 200.

The compound semiconductor chip 200 is fabricated using a wafer described below. The wafer is an epitaxial wafer including multilayer semiconductor films that are epitaxially grown on a semi-insulating GaAs (gallium arsenide) substrate by utilizing the Metal Organic Chemical Vapor Deposition (MOCVD).

Figure 13:
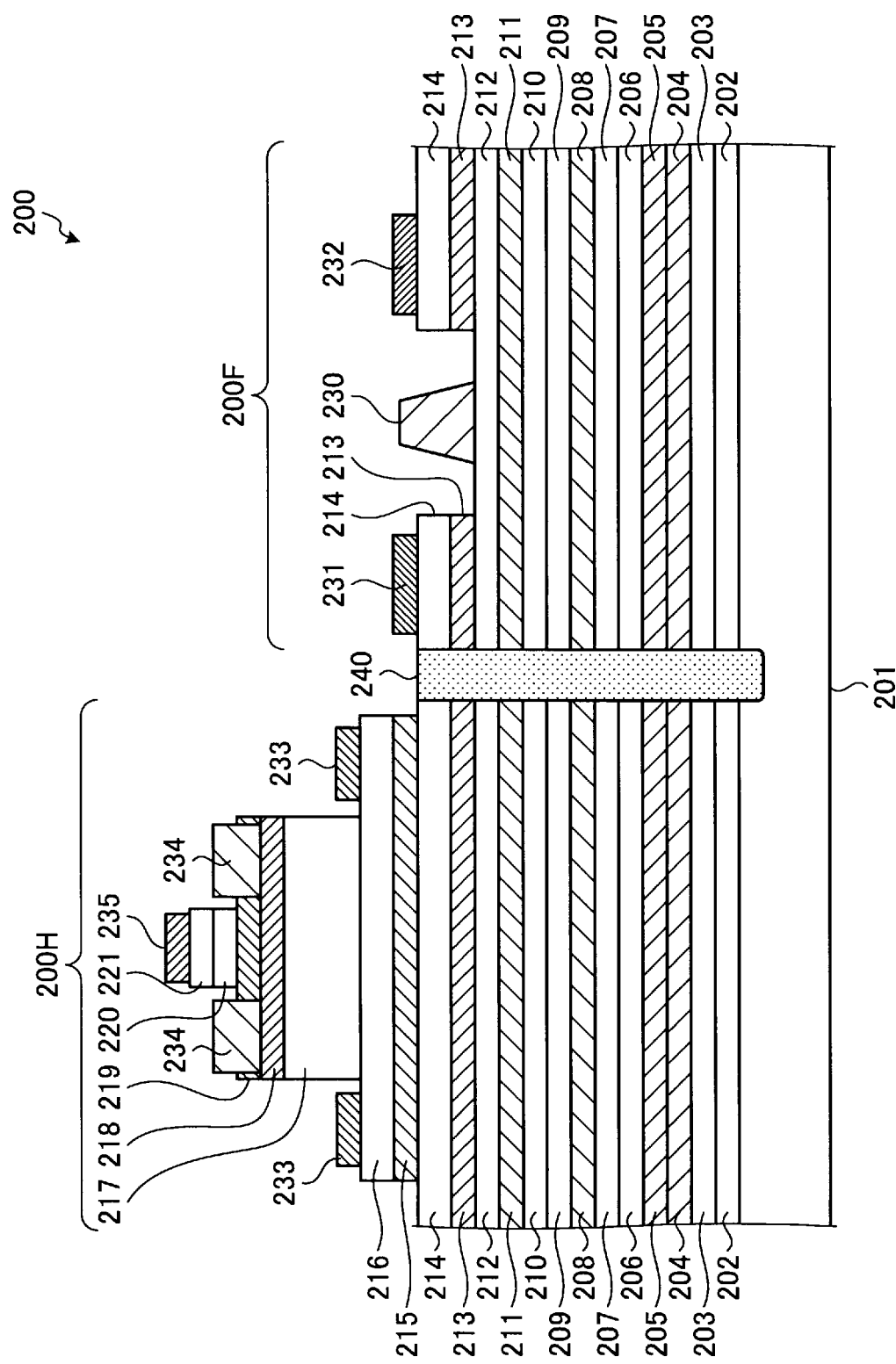
FIG. 13 is a sectional view of a part of a semiconductor chip according to the ninth embodiment.

FIG. 13 is a sectional view of a part of a semiconductor chip according to the ninth embodiment of the present disclosure. Various semiconductor components such as resistances, capacitors, inductors, wirings, pads, solder bumps, and Cu pillar bumps, insulating films, and so on are omitted for the purpose of mainly explaining the point that HBT and HEMT are formed on the one compound semiconductor chip 200.

The compound semiconductor chip 200 includes a HBT formation region 200H where the HBT is formed, and a HEMT formation region 200F where the HEMT is formed. An isolation region 240 is formed between the HBT formation region 200H and the HEMT formation region 200F. The isolation region 240 is obtained by forming an insulating region with ion implantation. The isolation region 240 electrically insulates the HBT formation region 200H and the HEMT formation region 200F.

On a semi-insulating GaAs substrate 201, there are successively laminated an undoped GaAs first buffer layer 202, an undoped AlGaAs (aluminum gallium arsenide) second buffer layer 203, a p-type AlGaAs third buffer layer 204, an n-type AlGaAs first carrier supply layer 205, an undoped AlGaAs first spacer layer 206, an undoped GaAs second spacer layer 207, an undoped InGaAs (indium gallium arsenide) channel layer 208, an undoped GaAs third spacer layer 209, an undoped AlGaAs fourth spacer layer 210, an n-type AlGaAs second carrier supply layer 211, an undoped AlGaAs Schottky layer 212, an undoped InGaP (indium gallium phosphide) first etching stopper layer 213, and an n-type GaAs first contact layer 214 in the mentioned order.

Among the laminated layers, those ones from the undoped GaAs first buffer layer 202 to the n-type GaAs first contact layer 214 are common to both the HBT formation region 200H and the HEMT formation region 200F.

In the HBT formation region 200H, an undoped InGaP second etching stopper layer 215, an n-type GaAs sub-collector layer 216, an n-type GaAs collector layer 217, a p-type GaAs base layer 218, an n-type InGaP emitter layer 219, an n-type GaAs cap layer 220, and an n-type InGaAs second contact layer 221 are successively laminated on the n-type GaAs first contact layer 214 in the mentioned order.

In the HBT formation region 200H, a collector electrode 233 is further formed on the n-type GaAs sub-collector layer 216. The collector electrode 233 is formed of a multilayer metal film containing AuGe, Ni and Au that are successively laminated in the mentioned order. AuGe in the lowermost layer of the collector electrode 233 is in contact with the n-type GaAs sub-collector layer 216.

In the HBT formation region 200H, a base electrode 234 is further formed on the p-type GaAs base layer 218. The base electrode 234 is formed of a multilayer metal film containing Pt, Ti, Pt and Au that are successively laminated in the mentioned order. Pt in the lowermost layer of the base electrode 234 penetrates through the n-type InGaP emitter layer 219 and comes into contact with the p-type GaAs base layer 218.

In the HBT formation region 200H, an emitter electrode 235 is further formed on the n-type InGaAs second contact layer 221. The emitter electrode 235 is formed of a multilayer metal film containing Mo, Ti, Pt and Au that are successively laminated in the mentioned order. Mo in the lowermost layer of the emitter electrode 235 is in contact with the n-type InGaAs second contact layer 221.

In the HEMT formation region 200F, a gate electrode 230 is formed on the undoped AlGaAs Schottky layer 212. The gate electrode 230 is formed of a multilayer metal film containing Ti, Pt and Au that are successively laminated in the mentioned order. Ti in the lowermost layer of the gate electrode 230 is in contact with the undoped AlGaAs Schottky layer 212.

In the HEMT formation region 200F, a source electrode 231 is further formed on the n-type GaAs first contact layer 214. The source electrode 231 is formed of a multilayer metal film containing AuGe, Ni and Au that are successively laminated in the mentioned order. AuGe in the lowermost layer of the source electrode 231 is in contact with the n-type GaAs first contact layer 214.

In the HEMT formation region 200F, a drain electrode 232 is further formed on the n-type GaAs first contact layer 214. The drain electrode 232 is formed of a multilayer metal film containing AuGe, Ni and Au that are successively laminated in the mentioned order. AuGe in the lowermost layer of the drain electrode 232 is in contact with the n-type GaAs first contact layer 214.

In the HEMT formed in the HEMT formation region 200F, current flows based on a phenomenon that electrons generated from a carrier supply layer are present as two-dimensional electron gas in a channel layer. In the ninth embodiment, the n-type AlGaAs first carrier supply layer 205 is arranged under the undoped InGaAs channel layer 208. The n-type AlGaAs second carrier supply layer 211 is arranged above the undoped InGaAs channel layer 208. Therefore, the concentration of two-dimensional electron gas present in the undoped InGaAs channel layer 208 can be increased, and hence the current driving capability of the HEMT can be increased.

Accordingly, the compound semiconductor chip 200 can increase the power gain of the power amplifier 1.

The ninth embodiment can be combined with the other embodiments. More specifically, the initial-stage bias circuit 4a according to the second embodiment, the initial-stage bias circuit 4b according to the third embodiment, the initial-stage bias circuit 4c according to the fourth embodiment, the initial-stage bias circuit 4d according to the fifth embodiment, the initial-stage bias circuit 4e according to the sixth embodiment, or the initial-stage bias circuit 4f according to the seventh embodiment may be formed on the compound semiconductor chip 200 instead of the initial-stage bias circuit 4 according to the ninth embodiment.

It is to be noted that the above-described embodiments are intended to make understanding of the present disclosure easier and are not to be construed as limiting the present disclosure. The present disclosure can be modified and/or improved within the scope of the disclosure, and equivalents resulting from modifications and improvements are also included in the present disclosure.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A power amplifier comprising:
   an initial-stage amplifier circuit comprising:
      a first high electron mobility transistor having a source electrically connected to a reference potential, and a gate to which a radio-frequency input signal is input, and
      a first heterojunction bipolar transistor having an emitter electrically connected to a drain of the first high electron mobility transistor, a base electrically connected to the reference potential in an alternate-current fashion via a first node, and a collector to which direct-current power is supplied and from which a radio-frequency signal is output;
   a second-stage amplifier circuit comprising:
      a third high electron mobility transistor having a source electrically connected to a reference potential, and a gate to which the radio-frequency signal output from the first heterojunction bipolar transistor is input, and
      a fifth heterojunction bipolar transistor having an emitter electrically connected to a drain of the third high electron mobility transistor, a base electrically connected to the reference potential in an alternate-current fashion via a third node, and a collector to which direct-current power is supplied and from which a radio-frequency signal is output;
   an output-stage amplifier circuit comprising:
      a second heterojunction bipolar transistor having an emitter electrically connected to the reference potential, a base to which the radio-frequency signal output from the fifth heterojunction bipolar transistor is input, and a collector to which direct-current power is supplied and from which a radio-frequency output signal is output;
   an initial-stage bias circuit configured to output a first bias voltage to the gate of the first high electron mobility transistor and a second bias voltage to the base of the first heterojunction bipolar transistor, the initial-stage bias circuit comprising:
      a third heterojunction bipolar transistor having a base electrically connected to the first node,
      a fourth heterojunction bipolar transistor having a base electrically connected to the first node, and an emitter electrically connected to a second node, the second node being electrically connected to the gate of the first high electron mobility transistor, and
      a capacitor connected between the first node and the reference potential;
   a second-stage bias circuit configured to output a fourth bias voltage to the gate of the third high electron mobility transistor and a fifth bias voltage to the base of the fifth heterojunction bipolar transistor, the second-stage bias circuit comprising:
      a sixth heterojunction bipolar transistor having a base electrically connected to the third node,
      a seventh heterojunction bipolar transistor having a base electrically connected to the third node, and an emitter electrically connected to a fourth node, the fourth node being electrically connected to the gate of the third high electron mobility transistor, and
      a capacitor connected between the third node and the reference potential; and
   an output-stage bias circuit configured to output a third bias voltage to the base of the second heterojunction bipolar transistor.

2. The power amplifier according to claim 1, wherein the first high electron mobility transistor is a depletion type high electron mobility transistor.

3. The power amplifier according to claim 1, wherein the third high electron mobility transistor is a depletion type high electron mobility transistor.

4. The power amplifier according to claim 1, wherein the initial-stage bias circuit comprises:
   the first node to which a reference current is supplied, and which is electrically connected to the base of the first heterojunction bipolar transistor;
   a second high electron mobility transistor having a source electrically connected to the reference potential;
   the third heterojunction bipolar transistor having an emitter electrically connected to a drain of the second high electron mobility transistor, and the base and a collector both electrically connected to the first node;
   the fourth heterojunction bipolar transistor having a collector electrically connected to a power supply potential, the base electrically connected to the first node, and the emitter electrically connected to the second node;
   a first resistance electrically connected between the second node and the gate of the first high electron mobility transistor;
   a second resistance electrically connected between the second node and the gate of the second high electron mobility transistor; and
   a third resistance electrically connected between the second node and the reference potential.

5. The power amplifier according to claim 1, wherein the second-stage bias circuit comprises:
   the third node to which a reference current is supplied, and which is electrically connected to the base of the fifth heterojunction bipolar transistor;
   a fourth high electron mobility transistor having a source electrically connected to the reference potential;
   the sixth heterojunction bipolar transistor having an emitter electrically connected to a drain of the fourth high electron mobility transistor, and the base and a collector both electrically connected to the third node;
   the seventh heterojunction bipolar transistor having a collector electrically connected to a power supply potential, the base electrically connected to the third node, and the emitter electrically connected to the fourth node;
   a fourth resistance electrically connected between the fourth node and the gate of the third high electron mobility transistor;
   a fifth resistance electrically connected between the fourth node and the gate of the fourth high electron mobility transistor; and a seventh resistance electrically connected between the fourth node and the reference potential.

6. The power amplifier according to claim 4, wherein the initial-stage bias circuit further comprises a resistance electrically connected between the base of the fourth heterojunction bipolar transistor and the first node.

7. The power amplifier according to claim 5, wherein the second-stage bias circuit further comprises a resistance electrically connected between the base of the seventh heterojunction bipolar transistor and the third node.

8. The power amplifier according to claim 4, wherein the initial-stage bias circuit further comprises a resistance electrically connected between the emitter of the fourth heterojunction bipolar transistor and the second node.

9. The power amplifier according to claim 5, wherein the second-stage bias circuit further comprises a resistance electrically connected between the emitter of the seventh heterojunction bipolar transistor and the fourth node.

10. The power amplifier according to claim 4, wherein the initial-stage bias circuit further comprises a resistance electrically connected between the base of the fourth heterojunction bipolar transistor and the first node and a resistance electrically connected between the emitter of the fourth heterojunction bipolar transistor and the second node.

11. The power amplifier according to claim 4, wherein the initial-stage bias circuit further comprises a capacitor electrically connected between the second node and the reference potential.

12. The power amplifier according to claim 4, wherein the initial-stage bias circuit further comprises a capacitor electrically connected between the gate of the second high electron mobility transistor and the reference potential.

13. The power amplifier according to claim 4, wherein the initial-stage bias circuit further comprises a capacitor electrically connected between the gate and the drain of the second high electron mobility transistor.

14. The power amplifier according to claim 4, wherein the initial-stage bias circuit further comprises a capacitor electrically connected between the second node and the drain of the second high electron mobility transistor.

15. The power amplifier according to claim 4, further comprising a reference current generation circuit configured to output the reference current to the first node in accordance with a control signal, wherein the reference current generation circuit comprises:
a constant current circuit configured to output the reference current to the first node;
a switch configured to selectively electrically connect the first node to the reference potential; and
a control circuit configured to control the output of the reference current from the constant current circuit, and to control a state of the switch.

16. The power amplifier according to claim 5, further comprising a reference current generation circuit configured to output the reference current to the third node in accordance with a control signal, wherein the reference current generation circuit comprises:
a constant current circuit configured to output the reference current to the third node;
a switch configured to selectively electrically connect the third node to the reference potential; and
a control circuit configured to control the output of the reference current from the constant current circuit, and to control a state of the switch.

17. A compound semiconductor device comprising the power amplifier according to claim 1, wherein at least the initial-stage amplifier circuit, the second-stage amplifier circuit, the output-stage amplifier circuit, the initial-stage bias circuit, the second-stage bias circuit, and the output-stage bias circuit are formed on a single compound semiconductor chip.

18. A compound semiconductor device comprising the power amplifier according to claim 2, wherein at least the initial-stage amplifier circuit, the second-stage amplifier circuit, the output-stage amplifier circuit, the initial-stage bias circuit, the second-stage bias circuit, and the output-stage bias circuit are formed on a single compound semiconductor chip.

19. A compound semiconductor device comprising the power amplifier according to claim 4, wherein at least the initial-stage amplifier circuit, the second-stage amplifier circuit, the output-stage amplifier circuit, the initial-stage bias circuit, the second-stage bias circuit, and the output-stage bias circuit are formed on a single compound semiconductor chip.

20. A compound semiconductor device comprising the power amplifier according to claim 6, wherein at least the initial-stage amplifier circuit, the second-stage amplifier circuit, the output-stage amplifier circuit, the initial-stage bias circuit, the second-stage bias circuit, and the output-stage bias circuit are formed on a single compound semiconductor chip.

* * * * *